United States Patent [19]

Chutjian et al.

[11] Patent Number: 4,902,647
[45] Date of Patent: Feb. 20, 1990

[54] SURFACE MODIFICATION USING LOW ENERGY GROUND STATE ION BEAMS

[75] Inventors: Ara Chutjian, La Crescenta; Michael H. Hecht, Los Angeles; Otto J. Orient, Glendale, all of Calif.

[73] Assignee: The United States of American as represented by the Administrator of the National Aeronautics and Space Administration, Washington, D.C.

[21] Appl. No.: 260,762

[22] Filed: Oct. 21, 1988

[51] Int. Cl.$^4$ .................. H01L 21/00; H01L 21/02; H01L 39/22; C23C 15/00
[52] U.S. Cl. .................... 437/239; 437/225; 437/228; 437/930; 437/936; 437/235; 437/238; 250/423 R; 250/427; 204/192.32; 204/192.34
[58] Field of Search .................. 437/239, 930, 936; 148/DIG. 169; 204/157.44, 192.34; 250/427

[56] References Cited

U.S. PATENT DOCUMENTS

| | | | |
|---|---|---|---|
| 4,351,712 | 9/1982 | Cuomo et al. | 204/192.34 |
| 4,541,890 | 9/1985 | Cuomo et al. | 204/192.34 |
| 4,649,273 | 3/1987 | Chutjian et al. | 250/251 |

FOREIGN PATENT DOCUMENTS

| | | |
|---|---|---|
| 1227289 | 9/1987 | Canada ........................ 250/427 |
| 0065901 | 5/1980 | Japan . |
| 0111019 | 7/1982 | Japan . |
| 0034831 | 2/1986 | Japan . |
| 0087340 | 5/1986 | Japan . |
| 0122040 | 6/1987 | Japan . |
| 2059150 | 4/1981 | United Kingdom ........... 250/427 |

OTHER PUBLICATIONS

Hart, D. M., Ion Source for Integrated Circuit and Memory Element Fabrication, IBM Tech. Dis. Bul., vol. 11, No. 10, 3/69, p. 1276.
Dworetsky, S., Electron Bombardment Ion Source for Low Energy Beams, Rev. of Scient. Instr., vol. 39, No. 11, Nov. 1968, pp. 1721-1723.
Ghandhi, S., VLSI Fabrication Principles, Chaps. 6 & 9, Wiley & Sons, 1983.
Sze, S., VLSI Technology, Chaps. 8 & 9, McGraw-Hill, 1983.
Wolf, S., Silicon Processing for the VLSI Era, vol. 1, Chaps. 9, 14 & 16, Lattice Press, 1986.
Vossen, Jr., Thim Film Processes, Chap. II-5, Academic Press, Inc., Harcourt Brace Jovanovich, 1978.

Primary Examiner—Brian E. Hearn
Assistant Examiner—B. Everhart
Attorney, Agent, or Firm—Thomas H. Jones; John R. Manning; Charles E. B. Glenn

[57] ABSTRACT

A method of effecting modifications at the surfaces of materials using low energy ion beams of known quantum state, purity, flux and energy. The ion beam is obtained by bombarding ion-generating molecules with electrons which are also at low energy. The electrons used to bombard the ion generating molecules are separated from the ions thus obtained and the ion beam is directed at the material surface to be modified. Depending on the type of ion generating molecules used, different ions can be obtained for different types of surface modifications such as oxidation and diamond film formation.

14 Claims, 1 Drawing Sheet

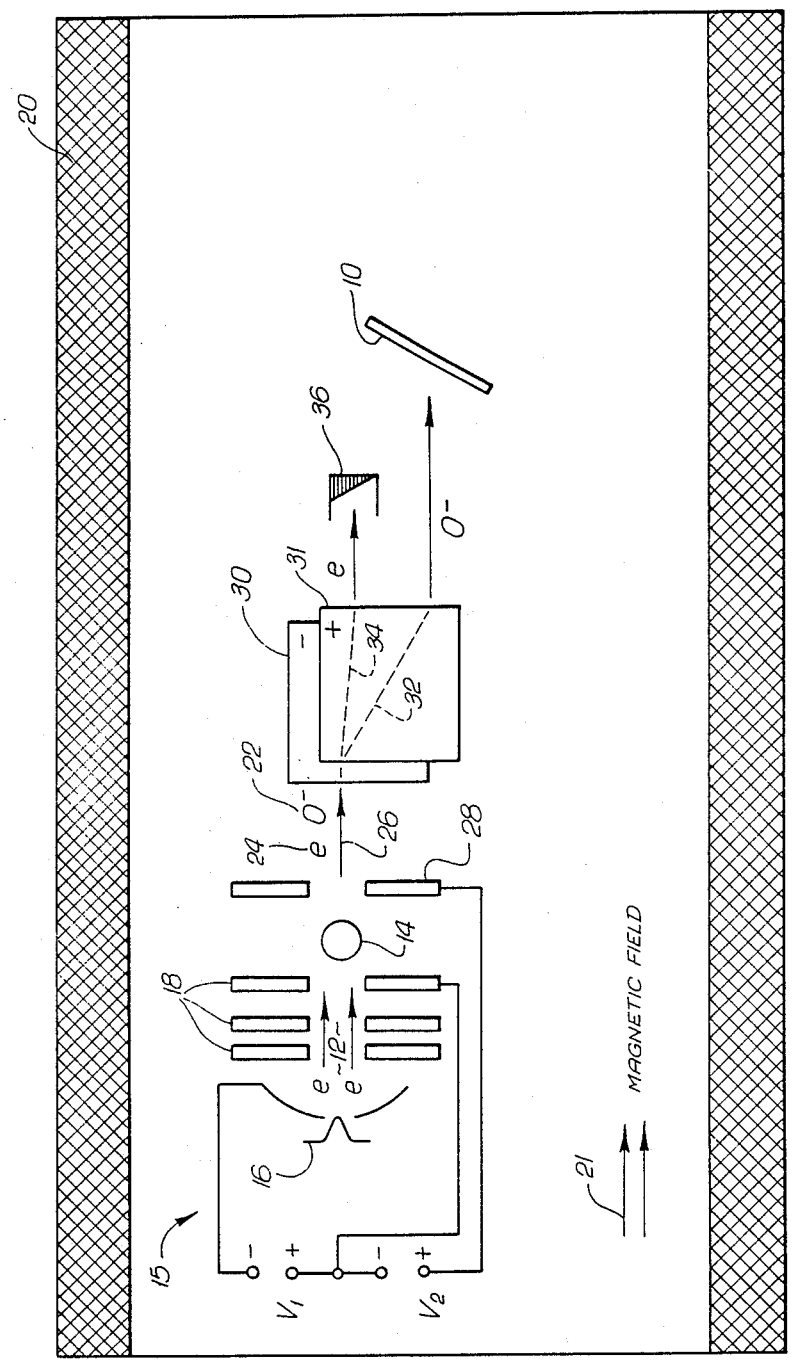

SURFACE MODIFICATION USING LOW ENERGY GROUND STATE ION BEAMS

BACKGROUND OF THE INVENTION

1. Origin of the Invention

The invention described herein was made in the performance of work under a NASA contract and is subject to the provisions of Public Law 96-517 (35 USC §202) in which the contractor has elected not to retain title. 2. Field of the Invention The present invention is directed to a process for effecting surface changes on materials. More particularly, this invention is directed to a process for fabrication of semiconductor devices.

DESCRIPTION OF THE RELEVANT ART

In the manufacture of semiconductor devices from semiconductor wafers such as silicon and gallium arsenide, the processes typically include modifications to the wafer surface, such as forming an oxide layer at the surface of the wafer. In the past, the surface layer of oxide is obtained by causing the surface of the wafer to oxidize at a high surface temperature ranging from 900°–1400° K. in a diffusion furnace. The prior art processes involve thermal diffusion which requires exposure of the wafer to an oxidizing agent at such elevated temperature. In such high temperature environments, it is inevitable that thermal stress is induced in the wafer which may damage its structure. This is especially true for denser, and radiation-hardened structures that can be destroyed by heating. Industry is currently investing considerable money in the development of lower temperature oxidation processes to sidestep these undesired effects. Other circumstances where high-temperature heating is undesirable include post-fabrication processing of integrated circuits, hybrid devices (GaAs on Si, where GaAs can be destroyed by oxidation; or where an interface can be damaged, or where metal interfaces can react), and in doped materials where the dopants may diffuse at high temperatures.

Another kind of, oxidation process is described in U.S. Pat. No. 4,251,712 to Cuomo et al. This is a surface reaction process for combined oxide growth and sputter etching using an ion beam. The process involves exposing a wafer to a high density oxygen ion beam of energies ranging from 30 to 180 eV generated in a plasma chamber. Although this process does not subject the wafer to high temperature in a furnace as in the oxidation process previously described, the temperature of the wafer is raised as a result of the action of the high energy ions thus requiring cooling the wafer in order to prevent damage to the wafer by thermal energy buildup. This process also possesses additional drawbacks. The oxygen ions produced from the plasma are of mixed energy. Some of the oxygen ions are of sufficient energy to cause displacement damage at the wafer surface, i.e., breaks in bonds at the uniform crystal surface. Furthermore, the plasma contains mixed reaction products including neutral particles, positive and negative ions, and electrons which may find their way to the wafer along with the oxygen ions in the reaction chamber. This causes contamination of the wafer which degrades the quality of the semiconductor obtained from the process.

In order to overcome the drawbacks associated with thermal energy buildup in the prior art processes, it is desirable to employ a method of forming an oxide layer on a wafer which involves using minimal thermal energy.

SUMMARY OF THE INVENTION

In accordance with the present invention, the surface modification of semiconductor wafers can be carried out by exposing the semiconductor wafer to a beam of low energy ions of known quantum state, purity, flux, and energy. The present invention provides improved control of the surface modification process, which can be optimized by controlling the surface temperature and the beam energy. Certain types of modification are possible at room temperature which would otherwise require elevated temperature. In addition, use of a charged particle beam lends itself to direct-write techniques by a combination of beam deflection and target masking.

In one aspect of the present invention, the surface of a semiconductor substrate, such as a silicon wafer, is oxidized by bombarding with a pure beam of $O^-$ ions in the ground state. The $O^-$ ions may be generated by directing a stream of electrons onto a high density beam of molecules of the type which will emit $O^-$ ions when bombarded with electrons. For example, a beam of NO molecules may be employed. The electrons are accelerated to sufficient energy to produce ground state $O^-$ ions, and not higher electronic states. The electrons are separated from the $O^-$ ions thus produced by electrostatic deflection. The $O^-$ ions are directed at the semiconductor surface to be oxidized.

In accordance with the present invention, other surface modifications can be obtained including diamond film formation, hydrogen annealing and reduction of silicon and gallium arsenide surfaces, development of diamond based radiation hard semiconductors, oxygen replenishment of thin film, high temperature superconducting films, and passivation of back surfaces of charged-coupled devices. These applications can be accomplished by use of suitable ion sources for the respective applications.

BRIEF DESCRIPTION OF THE DRAWING

FIG. 1 is a schematic longitudinal sectional view of an apparatus for oxidation of semiconductor surfaces according to one embodiment of the present invention.

DETAILED DESCRIPTION OF THE PREFERRED EMBODIMENT

The method of surface modification of the present invention is described below in reference to oxidation of a silicon wafer using an $O^-$ ion beam. In a preferred embodiment, the $O^-$ ions may be produced using the apparatus described in U.S. Pat. No. 4,644,273 to Chutjian et al., which is commonly assigned to the assignee of the present invention, the disclosure of which is incorporated herein by reference. The apparatus is however briefly summarized below.

FIG. 1 illustrates the apparatus for modification of the surface of a target material in the present invention. The apparatus is generally cylindrical in configuration and FIG. 1 shows the longitudinal sectional view along the axis of the apparatus. A stream of electrons 12 is projected along the axis of the apparatus perpendicularly through a high density beam of molecules 14. The beam of molecules is chosen to be such which will emit $O^-$ ions when bombarded with electrons. An example of a suitable molecule is nitric oxide (NO). The electrons 12 are emitted by thermionic emission from an electron gun 15–18 which comprises a filament 16 which is connected to an appropriate source of electrical power (not shown). A plurality of electrodes 18 connected to an adjustable power supply $V_1$ are provided to accelerate the emitted electrons 12 from the filament 16 towards the beam of molecules 14. As indicated schematically, $V_1$ may be adjusted between a negative potential and a positive potential. Electrical coil 20 of the superconducting type is provided around the electron gun 15 to produce an intense magnetic field 21 to confine the electrons in a high density stream. The stream of electrons 12 is accelerated to a desired energy as selected by the relative voltage applied to the electrodes 18. Preferably, the electrons are accelerated to an energy level between 1 to 15 eV in order to obtain $O^-$ ions in the ground state. The specific energy level of the electrons required is dependent on the particular has being used to form the $O^-$ ions. For example, for NO an energy of 8 eV is preferred.

When the beam of molecules 14 is bombarded by the stream of electrons 12, $O^-$ ions 22 are emitted. The $O^-$ ions are in the ground state since the energy of the electrons is low. The emitted $O^-$ ions 22 and the electrons 24 from the electron stream 12 form a combined stream 26 as indicated by the arrow. The combined stream 26 is accelerated to a desired energy, preferably less than 50 eV, by an additional electrode 28 connected to a power supply $V_2$. A pair of parallel spaced electrostatic plates 30 and 31 which are connected to a source of electrical power (not shown) is disposed adjacent to and on either side of the path of the combined stream 26 of electrons 24 and $O^-$ ions 22. The electrons 24 and $O^-$ ions 22 are deflected by different amounts under the action of electrostatic forces as they pass between the electrostatic plates 30 and 31. The amount of deflection is dependent upon the velocities of the electrons 24 and $O^-$ ions 22. $O^-$ ions being heavier, thus obtain a lower velocity from the acceleration force provided by the electrodes 28 than the electrons 24. The drift velocity acquired by the ions between plates 30 and 31 causes the ions 22 to be deflected by a greater amount than the electrons 24 as shown by dotted lines 32 and 34, respectively. A Faraday cup 36 is positioned to collect the electrons 24.

The $O^-$ ions 22 are directed at the target silicon wafer 10. In order to form a uniform oxide layer on the wafer, the beam is scanned across the target wafer 10. This can be done by moving the target wafer 10 with respect to the beam in a manner such that the beam scans the target uniformly, or by deflecting the beam in a raster scanning manner.

The direct chemical combination of the oxygen particles and the silicon wafer results in the growth of a thin film of silicon oxide on the surface of the silicon wafer 10. The initial rate of growth of the silicon oxide layer in this process is much faster than that in an oxidizing process involving thermal diffusion.

The results of the oxidation process as carried out in a laboratory is summarized below. A silicon wafer was exposed to a flux of $O^-$ ions of approximately $10^{14}$ lions/cm$^2$-s and 5 eV energy obtained by using electrons of 8 eV. The ions were in the $^2P$ quantum state. The diameter of the $O^-$ ion beam was approximately 0.50–0.75 mm. The silicon wafer was exposed to the $O^-$ ions for approximately 30 minutes.

At the end of the exposure to the $O^-$ ions, the wafer was analyzed by X-ray photoelectron spectroscopy. It was found that a 20 Å thick layer of silicon oxide had grown at the surface that had been exposed to the $O^-$ ions. This analysis also showed the presence of small amounts of nitrogen and carbon atoms on the surface-presumably from the background of NO gas and diffusion pump oil. These contaminants can be eliminated by the use of standard methods of differential pumping and ultrahigh vacuum at the target exposure area.

One preferred embodiment of the present invention has been described. Nevertheless, it will be understood that various modifications may be made without departing from the spirit and scope of the invention. Surface modifications other than oxidation of silicon wafers can be obtained using appropriate beams of ions. For example, the present invention can be advantageously utilized for diamond film formation using $C^-$ ions, hydrogen annealing and reduction of silicon and gallium arsenide surfaces using $H^-$ ions, development of diamond based radiation hardened semiconductors using $C^-$ ions, oxygen replenishment of thin film high temperature superconducting films and passivation of back surfaces of charged coupled devices using $O^-$ ions. For these applications, suitable ion generating molecules are used to generate the desired ions. Furthermore, by varying the energy of the electrons used to bombard the ion generating molecules, the desired quantum state of the ions can be obtained for the specific surface modification desired.

In summary, the present invention provides a method for effecting modification at the surface of a material by exposing the surface to a pure beam of low energy ions of known quantum state and purity. The surface modification process does not involve thermal diffusion at the surface and therefore can be carried out at low temperature.

While the invention has been described with respect to the preferred embodiment in accordance therewith, it will be apparent to those skilled in the art that various modifications and improvement may be made without departing from the scope and spirit of the invention. Accordingly, it is to be understood that the invention is not to be limited by the specific illustrated embodiment, but only by the scope of the appended claims.

We claim:

1. A method of effecting changes at the surface of a semiconductor material in the fabrication of semiconductor devices comprising the steps of:
   supplying a stream of molecules which will emit ions when bombarded with electrons;
   bombarding the stream of molecules with electrons which have been accelerated to sufficient energy to produce a beam composed of ions in the ground state; and
   directing the beam of ions in the ground state at the surface so as to effect changes at the surface without generating substantial heat.

2. A method as in claim 1 wherein the ions produced by bombardment of the molecules are accelerated to a selected energy before the ions reach the surface.

3. A method as in claim 2 wherein the energy level of the ions are selected within the range of 1 to 20 eV.

4. A method as in claim 3 wherein the surface is modified at room temperature.

5. A method as in claim 4 further comprising the step of separating the electrons used to bombard the molecules from the ion beam before the ion beam reaches the surface.

6. A method according to claim 5 wherein the electrons are separated from the ions by providing electrostatic plates to deflect the path of the ion beam.

7. A method of oxidizing a surface of a semiconductor comprising the steps of:
supplying a stream of molecules which will emit oxygen ions when bombarded with electrons;
bombarding the stream of molecules with electrons which have been accelerated to sufficient energy to produce a beam of oxygen ions in the ground quantum state; and
directing the beam of oxygen ions at the surface of the semiconductor material to oxidize the surface without generating substantial heat.

8. A method as in claim 7 further comprising the step of separating the electrons used to bombard the molecules from the oxygen ion beam before the oxygen ion beam reaches the surface of the semiconductor material.

9. A method as in claim 8 further comprising the step of accelerating the oxygen ions to a selected energy before the oxygen ions reach the semiconductor surface.

10. A method as in claim 9 wherein the oxygen ions are substantially in the ground state and the energy of the oxygen ions is selected within the range of 1 to 20 eV.

11. A method as in claim 10 wherein the semiconductor material is oxidized at room temperature.

12. A method as in claim 11 wherein the surface of the semiconductor is exposed to the oxygen ion beam for a duration in the order of 30 minutes to form a layer of oxide of a thickness in the order of 20Å on the surface of the semiconductor material.

13. A method according to claim 11 wherein the molecules are nitric oxide.

14. A method according to claim 13 wherein the energy of the electrons is selected within the range of 1 to 15 eV.

* * * * *